United States Patent [19]

Crafts

[11] 4,023,047
[45] May 10, 1977

[54] MOS PULSE-EDGE DETECTOR CIRCUIT

[75] Inventor: Harold Springer Crafts, Saratoga, Calif.

[73] Assignee: Data General Corporation, Westboro, Mass.

[22] Filed: Feb. 19, 1976

[21] Appl. No.: 659,306

[52] U.S. Cl. .............................. 307/363; 307/214; 307/246; 307/270
[51] Int. Cl.² ................ H03K 5/153; H03K 19/40; H03K 17/04; H03K 17/56
[58] Field of Search .......... 307/205, 208, 214, 246, 307/251, 268, 269, 270, DIG. 4, 235 R, 235 T, 232, 234, 235 W; 328/115, 150

[56] References Cited

UNITED STATES PATENTS

| 3,299,291 | 1/1967 | Warner, Jr. et al. | 307/205 X |
| 3,903,431 | 9/1975 | Heeren | 307/205 |
| 3,911,289 | 10/1975 | Takemoto | 307/214 X |

*Primary Examiner*—John S. Heyman
*Assistant Examiner*—Larry N. Anagnos
*Attorney, Agent, or Firm*—Jacob Frank; Joel Wall

[57] ABSTRACT

There is disclosed an MOS pulse-edge detector circuit. In certain applications it is desirable or necessary for an MOS switching circuit to respond substantially simultaneously to an edge of a control pulse. The present invention relates to a novel MOS component design which utilizes inherent or intrinsic capacitance thereof in a manner to detect and respond to an edge of a pulse such as a control or clock pulse at the time of occurrence of that edge.

5 Claims, 2 Drawing Figures

: 1

MOS PULSE-EDGE DETECTOR CIRCUIT

BACKGROUND OF THE INVENTION

1. Field of the Invention

The present invention relates generally to MOS circuitry, and more particularly to MOSFET circuitry which detects or responds to a pulse-edge.

2. Description of Prior Art

MOS (metal oxide semiconductor) technology is in a state of development, and is contributing substantially to growth of the electronics industry in general and particularly to the computer or data processing industry. The earlier bipolar technology is still extensively employed however, and both semiconductor techniques can be expected to be viable in the future.

For example, MOS field effect transistors (FETs) are employed in computer memories today, where data is stored in the memories in the form of voltages. That is, a binary "1" (or lack thereof, a "0") can be temporarily retained as a voltage on capacitors or capacitance intrinsic to the MOS circuit. Since the MOS circuit is constructed on a substrate or base from semiconductor materials which physically overlap each other (to form various circuit components such as transistors, gates, and other elements), an inherent or parasitic capacitance exists between various layers of semiconductor material forming these circuit elements. It is this very capacitance which is utilized in and essential to, operation of dynamic MOS memories.

In addition to utilization of MOSFETs in computer memories, they are used in other digital circuits. One of the problems associated with digital circuits is that there can be a competing switching or timing condition, where one element or component is switching at an arbitrary time, but precisely when another element or component at a different point in the system is switching, and where these two components are so interconnected that they provide conflicting or competing results or information.

For example, in some MOS circuit designs, it is desirable to employ different logic forms, (such as two-phase ratioed, static, four-phase ratioless, etc.), to obtain the advantages of each design. But, since the different logic forms are usually not mutually compatible, various problems result including the above-noted race or timing problems of the prior art. It is thus important to be able to control the precise time of occurrence of a change of state of a particular component. The present invention solves this problem of the prior art. The present invention controls precisely the time when a circuit element will change state responsive to, and substantially simultaneously with, the occurrence of an edge of a particular control pulse. It solves this problem employing the MOS technology as will be elaborated on hereinbelow.

SUMMARY OF THE INVENTION

The present invention relates to an MOS pulse-edge detector circuit. In addition to a supply voltage, the circuit includes first MOS circuitry which in turn includes first and second MOS components. These components are connected between the supply voltage and ground potential and they divide down the supply voltage at the node of the components. The circuit further includes second MOS circuitry also connected between the supply voltage and ground and adapted to receive the node voltage as an input signal. This second MOS circuitry establishes a threshold and provides a first output when the node voltage is above the threshold and a second output when the node voltage is below the threshold. The first MOS component of the first MOS circuitry includes gate, source, and drain elements, the drain element being connected to the supply and the source element being connected to the node; there is provided structure for receiving voltage pulses on the gate element. The first MOS circuitry includes capacitor means connected between the node and ground and larger-valued capacitor means connected between noted gate and source elements. These two capacitor means cooperate to cause inversion in relative value between the input signal and the threshold voltage substantially simultaneously with the occurrence of an edge of the voltage pulse applied to the gate element.

In a further feature of the present invention, the first output is low voltage and the second output is high voltage, and the voltage pulse edge is a falling edge.

For those design situations where it is critical to maintain switching of MOS circuitry under strict control, so that switching occurs precisely with edges of control pulses, it is a clear advantage to employ features of the present invention.

It is thus an object of the present invention to provide improved MOS circuitry.

It is a further object of the present invention to provide MOSFET switching circuitry which is responsive to edges of a control pulse substantially simultaneously with the occurrence of the respective edge.

Other advantages and objects will become apparent to those of ordinary skill in the art after reading the detailed description of the preferred embodiments in combination with the appended drawings wherein:

DESCRIPTION OF THE PREFERRED EMBODIMENTS

Figure 1:
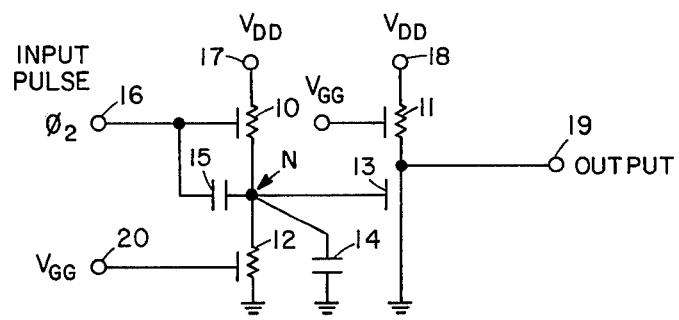
FIG. 1 is an illustrative embodiment of the circuitry of the present invention.

Referring to FIG. 1, FET 10 and FET 12 form a voltage divider as will be explained more fully below. The drain of FET 10 is connected to positive voltage $V_{DD}$ 17. The gate of FET 10 is connected to pulse terminal 16 as well to parasitic capacitance 15. The other end of parasitic capacitance 15 is connected to node N as well as to the source of FET 10.

Node N is further connected to the drain of FET 12 one end of parasitic capacitance 14, and the gate of FET 13. The other end of capacitor 14, the source of FET 13, and the source of FET 12, are all connected to ground. The gate of FET 12 is connected to terminal 20 to which bias $V_{GG}$ is applied.

Finally, FET 11 is connected between the drain of FET 13 and positive supply voltage $V_{DD}$ at terminal 18. The gate of FET 11 is connected to dc bias $V_{GG}$. The output is obtained at the junction of the source of FET 11 and the drain of FET 13. The combination of FET 11 and FET 13 forms an inverter circuit, as will also be explained more fully below.

It should be understood capacitors 14 and 15 are intrinsic or inherent or parasitic capacitance which exists by virtue of the nature of MOS geometry. This capacitance is to some extent voltage dependent, which feature will not be further elaborated upon herein for purposes of clarity of presentation and since further explanation is not necessary for complete understanding of the present invention. Suffice it to say that in the design of the MOSFET's of the present invention these capacitors are designed to have certain values. In the present invention, capacitance 15 is designed to be substantially larger than capacitor 14, and in a preferred embodiment is about three times larger than capacitor 14.

$V_{DD}$ represents a positive supply voltage, perhaps 15 volts. $V_{GG}$ represents a positive supply voltage of perhaps nine or ten volts. It should be understood that these terminals are labeled with either $V_{DD}$ or $V_{GG}$ for purposes of clarity of illustration, but these voltage values can be varied and could even be interchanged under certain conditions.

As noted earlier, the combination of FET 10 and FET 12 operates as a voltage divider: $V_{DD}$ is divided down by resistive divider action of FET 10 and FET 12. The combination of FET 11 and FET 13 operate as a voltage inverter; a high input to gate of FET 13, causes it to conduct providing a low output on terminal 19. In the preferred embodiment, the voltage required to maintain FET 13 conducting is approximately +6 volts, but this voltage threshold could be designed to be another value.

Figure 2:
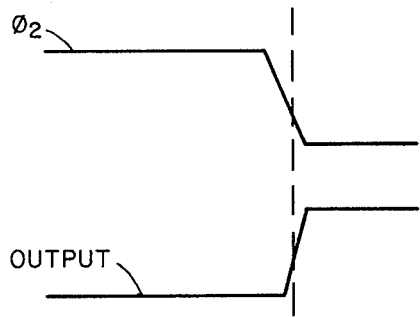
FIG. 2 is an illustration of input and output waveforms.

In operation, an input pulse waveform as shown in FIG. 2 is applied at terminal 16 and is identified as $\phi 2$. After this pulse is applied, node N is at a voltage potential sufficiently high to maintain FET 13 conducting, and in this case at least 6 volts. This 6 volt node N voltage is obtained by division of voltage from $V_{DD}$. At this point in time, as noted in FIG. 2, the output is low. Thus, for a high input there is obtained a low output, since a conducting FET 13 places a near-ground potential at output 19.

At the time of occurrence of the falling edge of $\phi 2$, the voltage pulse, capacitor 15 was charged to the differential between voltage on the node and the voltage of the applied voltage pulse. We can for purposes of illustration assume this pulse to be approximately 10 volts. When the input pulse, $\phi 2$, waveform is falling, the voltage across capacitor 15 (about 4 volts) cannot change instantaneously, as indicated by the $$i = c(de/dt) \quad (1)$$

where $i$ is current, $c$ is capacitance, and $(de/dt)$ is rate of change of voltage. This equation indicates that for the current to be less than infinite the change of voltage with respect to time must be finite. Thus, voltage cannot change across capacitor 15 instantaneously.

As a result, when the voltage of the input pulse decreases, a good portion of the decrease in voltage is transmitted through capacitor 15 of node N, thus reducing the voltage on node N rapidly. However, capacitor 14 is connected to node N, and its voltage change is constrained to be as rapid as the change in voltage at node N when the input pulse drops. A more rapid change in voltage is thus required across capacitor 14 than across capacitor 15, and this condition is met because capacitor 14 is smaller in value, in accordance with the principles of the present invention. It can be seen from equation (1) above that the smaller the value of $c$, the larger can be the value for $(de/dt)$, with no increase in current.

In other words, since capacitor 15 is designed to be large relative to capacitor 14, voltage at node N tends to follow the voltage at terminal 16. Accordingly, voltage at node N drops at almost the same rate that voltage at terminal 16 drops, which substantially simultaneously causes an inversion in relative magnitudes or a change in relative values between the voltage on node N and the threshold requirement of FET 13. Thus FET 13 turns off at this time, and output voltage shown in FIG. 2 increases substantially simultaneously with the falling edge of the input pulse.

It is significant that MOS capacitor 15 has been designed to be larger than MOS capacitor 14. Referring to equation (1) indicated above, it is seen that if capacitor 14 where made comparable in value to capicitor 15 then the substantially simultaneous result would not be obtained. The variation in node N voltage would not be quick, and the resultant response by the inverter would not be simultaneous.

The invention may be embodied in yet other specific forms without departing from the spirit or essential characteristics thereof. For example, an exemplary embodiment of the present invention has been described in connection with the negative-going, trailing edge of a voltage pulse which simultaneously provides an input signal to the gate of FET 13. But, it is within the purvue of the present invention to operate upon leading and trailing edges of positive and negative going pulses since, for example, the leading edge of a negative voltage pulse is also a falling edge; appropriate supply and bias polarity changes that may be necessary to accomodate other pulses are thus also within the purvue of the present invention. Furthermore, the symbols used for the FET 10, 11, 12, and 13 are used in industry; FET 13 is depicted differently from the others to indicate that its resistance is lower than the other FET's.

Thus, the present embodiments are to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. An MOS pulse-edge detector circuit comprising:
   a supply voltage;
   first MOS circuit means, including first and second MOS components serially connected between said supply voltage and ground potential, for dividing down said supply voltage at the node of said components;
   second MOS circuit means, connected between said supply voltage and ground potential and adapted to receive said node voltage as an input signal, for establishing a threshold voltage and for providing a first output when said input signal is above said threshold voltage and a second output when said input signal is below said threshold voltage;
   said first MOS component including gate, source, and drain elements, said drain element being connected to said supply voltage, said source element being directly connected to said node;
   means for receiving a voltage pulse on said gate element;
   said first MOS circuit means including capacitor means connected between said node and ground potential, and larger-valued capacitor means connected between said gate element and said source element, whereby at least both capacitor means co-operate to cause inversion in relative values of said input signal and said threshold voltage substantially simultaneously with the occurrence of an edge of said voltage pulse.

2. A circuit as recited in claim 1 and wherein said first output is low voltage and said second output is high voltage.

3. A circuit as recited in claim 2 including a voltage bias, and wherein said second MOS component includes other gate, source, and drain elements, said other gate element being connected to said voltage bias, said other source element being connected to said ground potential, and said other drain element being connected to said node.

4. A circuit as recited in claim 3 and wherein said larger-valued capacitor means is designed to be about three times as large as said capacitor means.

5. A circuit as recited in claim 4 and wherein said edge of said voltage pulse is a falling edge.

* * * * *